(12) United States Patent
Hsu et al.

(10) Patent No.: US 7,972,145 B2
(45) Date of Patent: Jul. 5, 2011

(54) ELECTRICAL CONNECTOR HAVING ADAPTER WITH HOOK SO AS TO PREVENT AND REDUCE DISTORTION OF THE ADAPTER

(75) Inventors: Hsiu-Yuan Hsu, Tu-Cheng (TW); Ke-Hao Chen, Tu-Cheng (TW)

(73) Assignee: Hon Hai Precision Ind. Co., Ltd., Taipei (TW)

( * ) Notice: Subject to any disclaimer, the term of this patent is extended or adjusted under 35 U.S.C. 154(b) by 0 days.

(21) Appl. No.: 12/828,304

(22) Filed: Jul. 1, 2010

(65) Prior Publication Data

US 2011/0003500 A1    Jan. 6, 2011

(30) Foreign Application Priority Data

Jul. 1, 2009  (TW) .................................. 98211886

(51) Int. Cl.
  *H05K 1/00*  (2006.01)
(52) U.S. Cl. ......................................... 439/73; 439/331
(58) Field of Classification Search .................... 439/73, 439/331

See application file for complete search history.

(56) References Cited

U.S. PATENT DOCUMENTS

| 2001/0012707 A1* | 8/2001 | Ho et al. .......................... 439/71 |
| 2001/0012725 A1* | 8/2001 | Maeda et al. .................. 439/526 |
| 2003/0100201 A1* | 5/2003 | Ikeya et al. ..................... 439/73 |

* cited by examiner

*Primary Examiner* — Gary F. Paumen
(74) *Attorney, Agent, or Firm* — Andrew C. Cheng; Wei Te Chung; Ming Chieh Chang

(57) ABSTRACT

An electrical connector (100) adapted for electrically connecting a package to a printed circuit board comprises a base (4), an adapter (3) assembled on the base (4), a plurality of contacts (6) received in the base (4), a frame (1) assembled on the base (4) and moves up and down relative to the base (4), an actuator (2) assembled on the base (4) and moves from a closed position to an opened position when the frame (1) moves up and down, the base (4) comprises a plurality of passageways (4101), the adapter (3) comprises a plurality of receiving holes (31) corresponding to the passageways (4101) of the base (4), the contacts (6) are received in the passageways (4101) and go through the receiving holes (31), a hook (311) is formed on one of the adapter (3) and the base (4) to latch the adapter (3) on the base (4).

19 Claims, 5 Drawing Sheets

ELECTRICAL CONNECTOR HAVING ADAPTER WITH HOOK SO AS TO PREVENT AND REDUCE DISTORTION OF THE ADAPTER

BACKGROUND OF THE INVENTION

1. Field of the Invention

The present invention relates to an electrical connector, and more particularly to an electrical connector having adapter with hook so as to prevent and reduce diction of the adapter.

2. Description of the Related Art

Electronic packages, such as integrated circuits (IC) packages, are miniaturized electronic devices in which a number of active and passive circuit elements are located on or within a continuous body of material to perform the intended function of a complete circuit. To ensure reliability in use, the IC packages require a run-in process to test their durability prior to their shipment, which is also referred to as burn-in process. The IC packages are operated at a pre-determined environment, such as exposed to a high temperature for an extended period of time to accelerate potential failure points. This helps to eliminate early failures once the IC packages are sold and/or assembled onto electronic end products. Thus, a burn-in socket is used to serve this purpose, and to electrically connect the IC package with a burn-in board for operation of the IC package at the intended requirements.

Referring to FIG. 1, a conventional electrical connector is used to test a package to a circuit substrate and comprises a base 40, an adapter 30 assembled on the base 40, a plurality of contacts 60 assembled on the base 40, a frame 10 assembled on the base 40 and a clamping latch 26 assembled on the frame 10. The contacts 60 each has a first contact portion 61 extending beyond the top surface of the adapter 30 to connect to the package and a second contact portion 62 extending beyond the bottom surface of the base 40 to connect to the printed circuit board. The frame 10 moves up and down relative to the base 40 to urge the clamping latch 26 to move from the closed position to the opened position.

In use, the frame 10 is firstly depressed to make it move downwardly and the clamping latch 26 is urged to the opened position by the frame 10, then the package is disposed/placed on the top surface of the adapter 30; secondly, the frame 10 is released and it moves upwardly to make the clamping latch 26 to move to the closed position, the clamping latch 26 presses on the package to make it connect with the contacts 60, thus a good connection is made between the package and the circuit substrate.

The adapter 30 is made of plastic and is easy to be deformed, if the adapter 30 is deformed upwardly, the first contact portion 61 of the contacts 60 will not extend beyond the top surface of the adapter 30, then the package will disconnect with the contacts 60. The electrical connector will not complete the test work normally.

Hence, an improved electrical connector is required to overcome the disadvantages of the prior art.

SUMMARY OF THE INVENTION

An object of the invention is to provide an electrical connector having improved adapter matched with the base to prevent the distortion of the adapter.

To achieve the above-mentioned object, an electrical connector adapted for electrically connecting a package to a printed circuit board, comprises a base, an adapter assembled on the base, a plurality of contacts received in the base, a frame assembled on the base and moving up and down relative to the base, an actuator assembled on the base and moves from a closed position to an opened position when the frame moves up and down, the base comprises a plurality of passageways, the adapter comprises a plurality of receiving holes corresponding to the passageways of the base, the contacts are received in the passageways and go through the receiving holes, a hook is formed on one of the adapter and the base to latch the adapter on the base.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
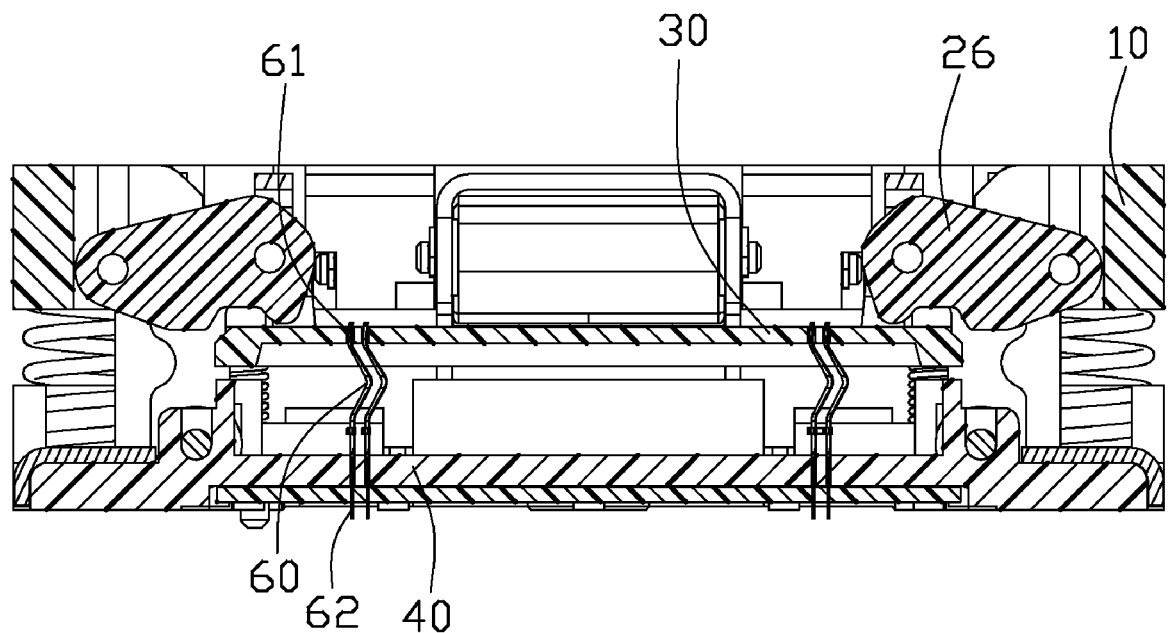
FIG. 1 is a cross-sectional view of a conventional electrical connector.
Figure 2:
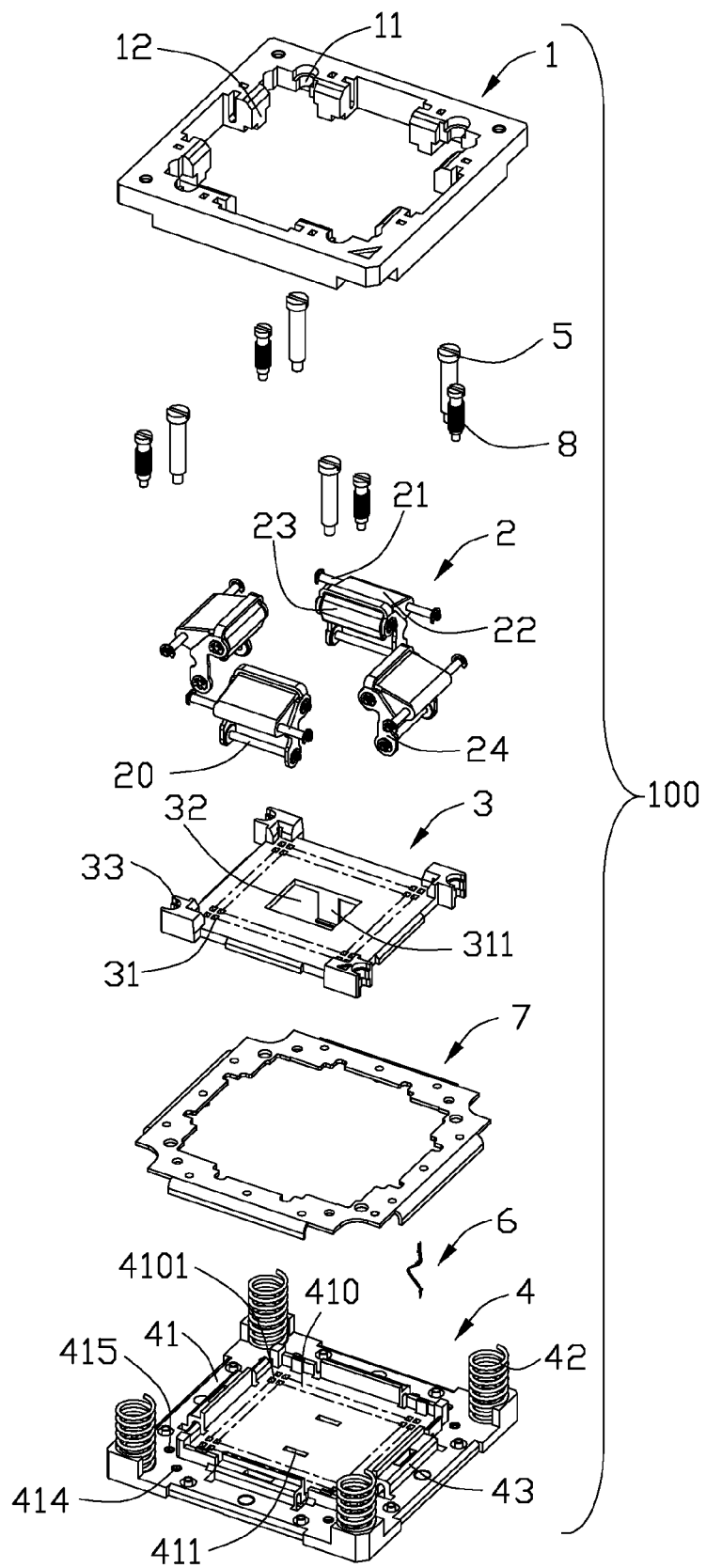
FIG. 2 is an exploded, perspective view of an electrical connector in accordance with a preferred embodiment of the present invention.
Figure 3:
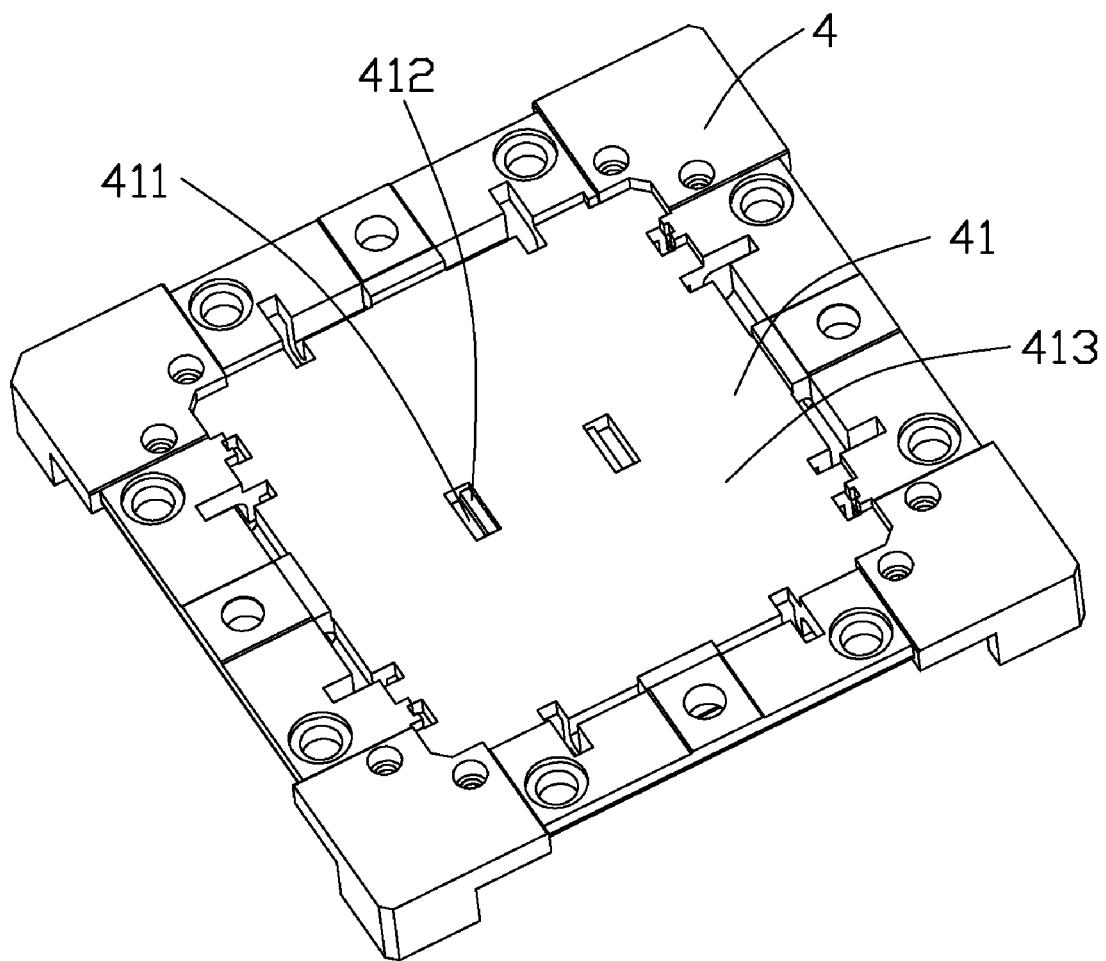
FIG. 3 is a bottom view of the base shown in FIG. 2.

Referring to FIGS. 2-3, an electrical connector 100 made in accordance with a preferred embodiment of the present invention is adapted for electrically connecting an integrated circuit (IC) package (not shown) to a printed circuit board (not shown). The electrical connector 100 comprises a base 4 with a plurality of contacts 6 received therein, a reinforcement 7 and an adapter 3 assembled on the base 4, a frame 1 assembled on the base 1 and can move up and down relative to the base 1, an actuator 2 assembled on the base and the frame 1, and four springs 42 assembled between the frame 1 and the base 4. The actuator 2 moves from a closed position to an opened position when the frame 1 moves downwardly.

The base 4 comprises a flat body portion 41 and a plurality of fix portions 43 extending upwardly from the body portion 41. The body portion 41 comprises a top surface 410, a bottom surface 413 opposite to the top surface 410 and a plurality of passageways 4101 impenetrate the top surface 410 and the bottom surface 413. The body portion 41 also comprises a pair of apertures 411 among the passageways 4101 and a recess 412 near the aperture 411. The recess 412 is set on the bottom surface 413. The springs 42 are located on the four corners of the base 4. The base 4 comprises a first hole 415 near the spring 42 and a third hole 414 near the first hole 415.

The frame 1 comprises a forth hole 11 corresponding to the third hole 414 and a plurality of positioning portions 12. The actuator 2 comprises a press portion 23 to press the IC package and a rear portion 22 opposite to the press portion 23. The two sides of the press portion 23 are connected to a shaft 20 by a joint sheet 24 and the press portion 23 can rotate relative to the joint sheet 24. The shaft 20 is positioned on the fix portion 43 of the base 4 thereby the press portion 23 is connected to the base 4. A pin 21 goes through the rear portion 22 of the actuator 2 and is positioned on the positioning portions 12 of the frame 1. Thereby the rear portion 22 is positioned on the frame 1.

The adapter 3 comprises a plurality of receiving holes 31 corresponding to the passageways 4101 of the base 4. The contacts 6 go through the receiving holes 31 to connect with the IC package on the adapter 3. The adapter 3 also comprises a window 32 near a middle portion thereof and a pair of hooks 311 extending downwardly from the adapter 3 near the window 32. The adapter 3 also defines a second hole 33 corresponding to the first hole 415 of the base 4.

Figure 4:
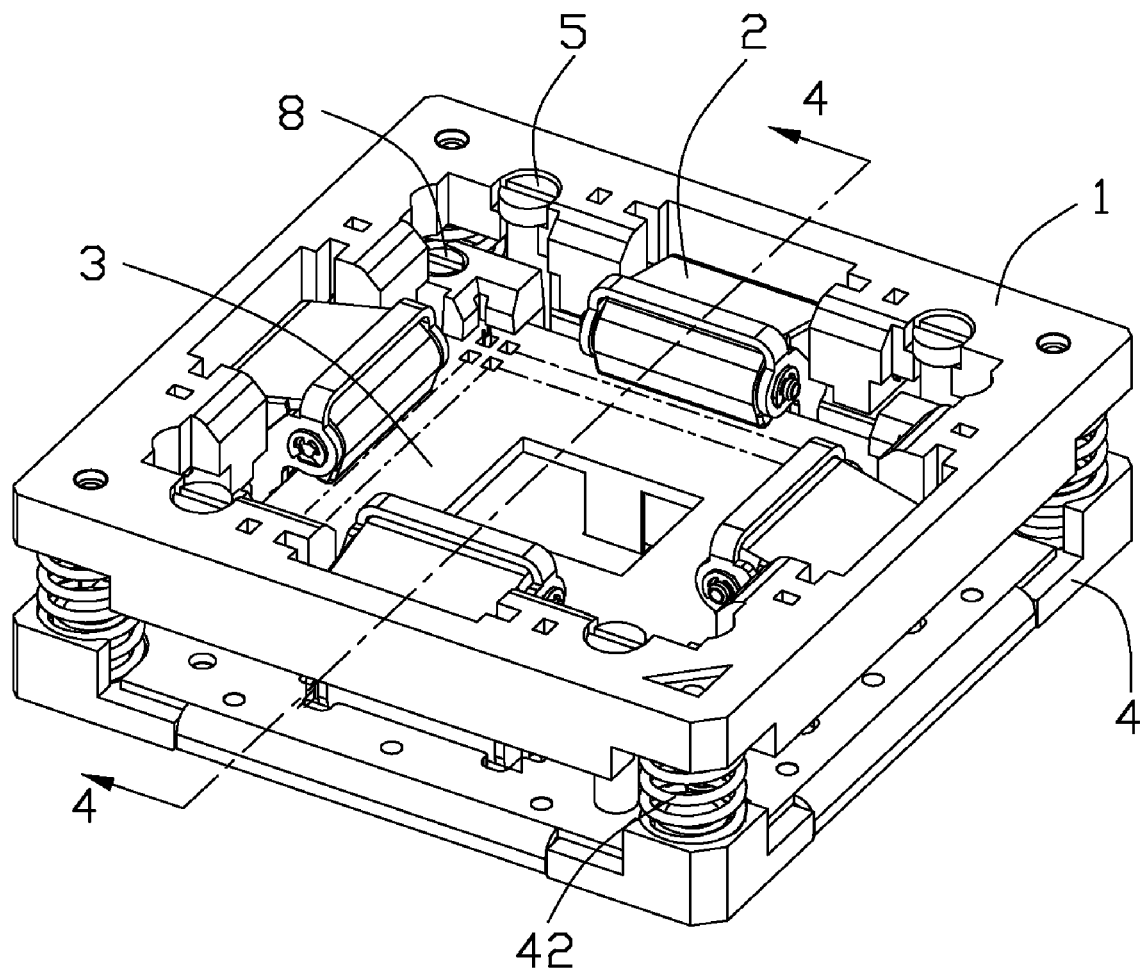
FIG. 4 is an assembled view of the electrical connector shown in FIG. 2.
Figure 5:
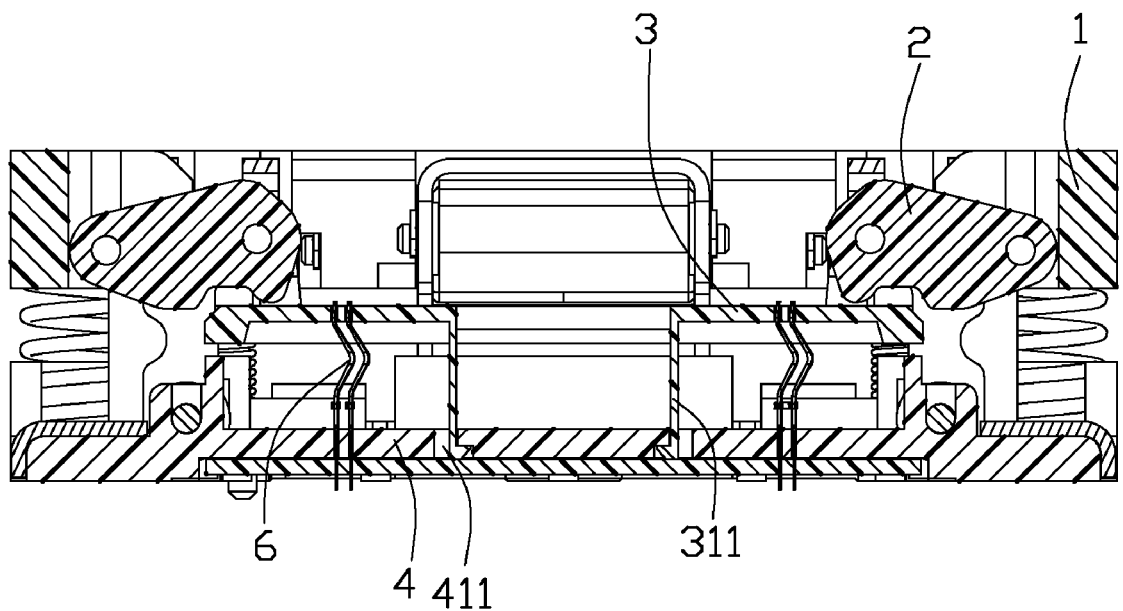
FIG. 5 is a cross-sectional view of the electrical connector taken along line 4-4 in FIG. 4.

Referring to FIGS. 4-5, the assembled electrical connector 100 is shown. A screw 8 goes through the second hole 33 of the adapter 3 and the first hole 415 of the base 4 to assemble the adapter 3 on the base 4. The hooks 311 go through the apertures 411 to engage with the base 4 and the recess 412 such that the hook 311 does not go beyond the bottom surface 413 of the base 4. Then, a bolt 5 goes through the forth hole 11 of the frame 1 and the third hole 414 of the base 4 to assemble the frame 1 on the base 4. The springs 42 are located between the frame 1 and the base 4. The actuator 2 is assembled to the base 4 by the joint sheet 24 and is assembled to the frame 1 by the pin 21. The hook 311 of the adapter 3 engages with the base 4 to prevent the distortion of the adapter 3, thus the contacts 6 can go through the receiving holes 31 to connect with the IC package on the adapter 3. In addition, the hook 311 could also be set on the base 4 to latch with the adapter 3 which also can reach the effect.

In use, the frame 1 is pressed downwardly so that the rear portion 22 of the actuator 2 also goes downwardly with the frame 1, and the press portion 23 goes upwardly to the opened position whereby the IC package is put on the adapter 3. Then the frame 1 is released, the rear portion 22 goes upwardly with the frame 1 and the press portion 23 goes downwardly to the closed position to press on the IC package. Thus, a good connection is established between the IC package and the contacts 6.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector adapted for electrically connecting a package to a printed circuit board, comprising:
    a base comprising a plurality of passageways;
    an adapter assembled on the base and comprising a plurality of receiving holes corresponding to the passageways of the base;
    a plurality of contacts received in the passageways and going through the receiving holes;
    a frame assembled on the base and moving up and down relative to the base; and
    an actuator assembled on the base and moved from a closed position to an opened position when the frame moves up and down;
    wherein a hook is formed on a central portion of one of the adapter and the base to latch the adapter on the base.

2. The electrical connector as described in claim 1, wherein the hook comprises a vertical arm extends downwardly from the adapter and a protrusion engaging with the base.

3. The electrical connector as described in claim 2, wherein the base comprises an aperture, the hook of the adapter goes through the aperture to hook with the base.

4. The electrical connector as described in claim 3, wherein the base also comprises a recess near the aperture, the hook partly received in the recess.

5. The electrical connector as described in claim 1, wherein the base comprises a first hole and the adapter comprises a second hole corresponding to the first hole, a screw goes through the second hole and the first hole to assemble the adapter on the base.

6. The electrical connector as described in claim 1, wherein the adapter comprises a window and the hook is near the window.

7. The electrical connector as described in claim 1, wherein the base comprises a third hole and the frame comprises a fourth hole corresponding to the third hole, a bolt goes through the fourth hole and the third hole to assemble the frame on the base.

8. The electrical connector as described in claim 1, wherein the actuator comprises a press portion to press the package and a rear portion opposite to the press portion.

9. The electrical connector as described in claim 8, wherein the two sides of the press portion are connected to a shaft positioned on the base by a joint sheet and the press portion can rotate relative to the joint sheet.

10. The electrical connector as described in claim 9, wherein a pin is positioned on the frame and goes through the rear portion of the actuator to position the actuator on the frame.

11. An electrical connector adapted for electrically connecting a package to a printed circuit board, comprising:
    a base with a plurality of contacts received therein;
    an adapter assembled on the base and the contacts extending out the adapter, the adapter comprising a window at a central portion thereof and a hook extending downwardly near the window to hook with the base;
    a frame assembled on the base and can move up and down relative to the base; and
    an actuator assembled on the base and moved from a closed position to an opened position when the frame moves up and down.

12. The electrical connector as described in claim 11, wherein the base comprises an aperture, the hook of the adapter goes through the aperture to hook with the base.

13. The electrical connector as described in claim 12, wherein the base also comprises a recess near the aperture and the hook is partly received in the recess.

14. The electrical connector as described in claim 11, wherein the actuator comprises a press portion to press the package and a rear portion opposite to the press portion.

15. The electrical connector as described in claim 14, wherein the two sides of the press portion are connected to a shaft positioned on the base by a joint sheet and the press portion can rotate relative to the joint sheet.

16. The electrical connector as described in claim 15, wherein a pin is positioned on the frame and goes through the rear portion of the actuator to position the actuator on the frame.

17. An electrical connector adapted for electrically connecting a package to a printed circuit board, comprising:
    a base comprising a plurality of passageways;
    an adapter assembled on the base and comprising a plurality of receiving holes corresponding to the passageways of the base;
    a plurality of contacts received in the passageways and going through the receiving holes;
    a frame assembled on the base and moving up and down relative to the base; and
    an actuator assembled on the base and moved between a closed position and an opened position when the frame moves up and down; wherein both a central area and a peripheral area of said adaptor are equipped with retention structures to hold the adaptor in position with regard to the base without risks of distortion thereof.

18. The electrical connector as claimed in claim 17, wherein the contacts provide resilient forces to urge the adaptor away from the base.

19. The electrical connector as claimed in claim 17, wherein said retention structure includes a hook formed on one of the base and the adaptor, and an aperture in the other, through which said hook extends and secure to the other.

* * * * *